United States Patent [19]

Sei et al.

[11] Patent Number: 5,216,293
[45] Date of Patent: Jun. 1, 1993

[54] CMOS OUTPUT BUFFER WITH PRE-DRIVE CIRCUITRY TO CONTROL SLEW RATE OF MAIN DRIVE TRANSISTORS

[75] Inventors: Toshikazu Sei, Kawasaki; Yasunori Tanaka; Shinji Ochi, both of Yokohama, all of Japan

[73] Assignee: Kabushiki Kaisha Toshiba, Kawasaki, Japan

[21] Appl. No.: 814,438

[22] Filed: Dec. 30, 1991

[30] Foreign Application Priority Data

Jan. 14, 1991 [JP] Japan .................. 3-002815

[51] Int. Cl.⁵ .............. H03K 17/16; H03K 19/0948; H03K 6/04
[52] U.S. Cl. .................. 307/443; 307/451; 307/263
[58] Field of Search .......... 307/263, 443, 451

[56] References Cited

U.S. PATENT DOCUMENTS

| | | |
|---|---|---|
| 4,791,321 | 12/1988 | Tanaka et al. .................. 307/451 |
| 4,797,579 | 1/1989 | Lewis .................. 307/443 |
| 4,859,870 | 8/1989 | Wong et al. .................. 307/443 |
| 4,972,100 | 11/1990 | Lim et al. .................. 307/443 |
| 5,013,940 | 5/1991 | Ansel .................. 307/443 |
| 5,117,131 | 5/1992 | Ochi et al. .................. 307/443 |

*Primary Examiner*—Edward P. Westin
*Assistant Examiner*—Benjamin D. Driscoll
*Attorney, Agent, or Firm*—Finnegan, Henderson, Farabow, Garrett & Dunner

[57] ABSTRACT

A CMOS output buffer comprises an output stage circuit including MOS transistors each having a CMOS structure, for outputting a signal, and an output stage control circuit arranged prior to the output stage circuit. The output stage control circuit includes a pull-up circuit and a pull-down circuit for controlling the gate of the final stage MOS transistor of the MOS transistors so that a speed at which a gate-to-source voltage varies when the final stage MOS transistor is turned on, is slower than a speed at which the gate-to-source voltage varies when the final stage MOS transistor is turned off.

9 Claims, 4 Drawing Sheets

CMOS OUTPUT BUFFER WITH PRE-DRIVE CIRCUITRY TO CONTROL SLEW RATE OF MAIN DRIVE TRANSISTORS

BACKGROUND OF THE INVENTION

1. Field of the Invention

The present invention relates to a CMOS output buffer for use in a semiconductor device, particularly in a CMOS digital circuit.

2. Description of the Related Art

Since a semiconductor chip of a semiconductor device is generally packaged, an output buffer included in the semiconductor chip is connected to an external circuit by means of a lead frame. The lead frame has an inductance L. If a current I, which flows into or from an internal circuit of the semiconductor chip, varies, noise is generated in the power line at a rate expressed by the following formula.

$$L \times (dI/dt) \ldots (1)$$

In the formula (1), dI/dt indicates a variation in the current I with respect to time.

The noise will be described with reference to FIG. 1. FIG. 1 shows operating waveforms of a conventional output buffer which is usually provided in an internal circuit of a semiconductor chip. The waveforms shown in FIG. 1 are input waveform 41 and output waveform 42 of the output buffer, waveform 43 of ground voltage VSS, and waveform 44 of power supply voltage VDD.

The noise includes two peak noises. One of the peak noises occurs on a power line at the beginning of switching or when the voltage of an output terminal starts to change, and is called an initial noise and indicated by reference numeral 61 of FIG. 1. The other peak noise is an undershoot 62 or an overshoot 63 affecting the power line after an output voltage reaches the final level, and is called a ringing noise and indicated by reference numeral 64 in FIG. 1.

The initial noise 61 is generated by an increase in the current flowing to a power supply terminal to charge a capacitive load which parasitizes the output terminal of the output buffer. The ringing noise 64 is generated by a decrease in the current when the charge or discharge of the output terminal is finished. The noises tend to be bigger as the drive ability of the output buffer becomes greater.

FIG. 2 is a conventional circuit diagram wherein output buffers, which have a small drive ability and generate a relatively small amount of noise, are connected in parallel between an input terminal 45 and an output terminal 46, as disclosed in U.S. Pat. No. 4,789,793. The peak value of the initial noise is reduced by subtly shifting the operation timing of the respective output buffers 47.

In the circuit arrangement shown in FIG. 2, the input terminals of the output buffers 47 have parasitic capacitances C0, C1, C2, ..., $C_{n-1}$, and resistors R1, R2, ..., $R_{n-1}$ are connected between the input terminals of the output buffers 47. The CR time constant is thus delayed and the circuit arrangement makes use of the delay in the CR time constant.

The conventional circuit arrangement causes a problem of through current by competition between the output buffer operated first and the output buffer operated later. Therefore, the operation timing cannot be greatly shifted. As is apparent from an output waveform 48, a VSS waveform 49, and a VDD waveform 50 shown in FIG. 3, the conventional circuit arrangement is effective against the initial noise 61 and not so effective against the ringing noise 64.

SUMMARY OF THE INVENTION

It is accordingly an object of the present invention to provide a CMOS output buffer used in an integrated circuit, which reduces noise generated on a power line and an output terminal when the output buffer is operated, thereby preventing the integrated circuit from malfunctioning because of the noise.

To attain the above object, there is provided a CMOS output buffer comprising:

an output stage circuit including MOS transistors each having a CMOS structure, for outputting a signal; and an output stage control circuit arranged prior to the output stage circuit and constructed so that a speed at which a gate-to-source voltage varies when a final stage MOS transistor of the MOS transistors is turned on, is slower than a speed at which the gate-to-source voltage varies when the final stage MOS transistor is turned off.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described with reference to the accompanying drawings.

Figure 1:
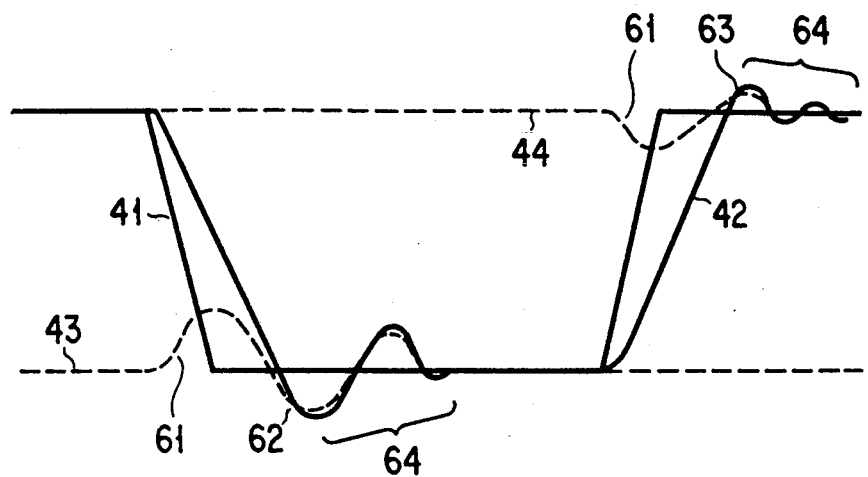
FIG. 1 is a view showing operating waveforms of a conventional output buffer commonly used in a semiconductor integrated circuit.
Figure 2:
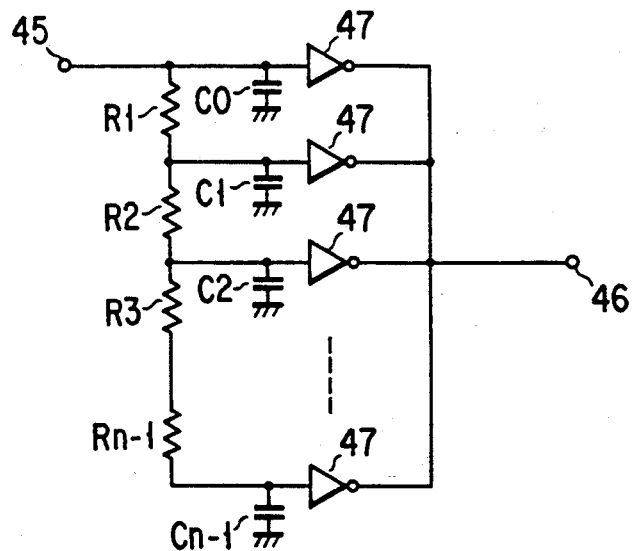
FIG. 2 is a circuit diagram showing an arrangement of the conventional output buffer.
Figure 3:
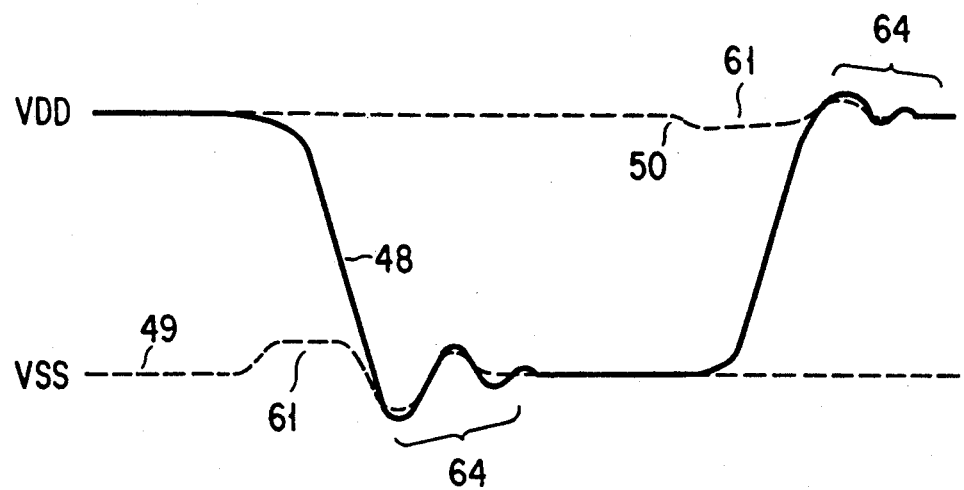
FIG. 3 is a view showing operating waveforms of the output buffer of FIG. 2.
Figure 4:
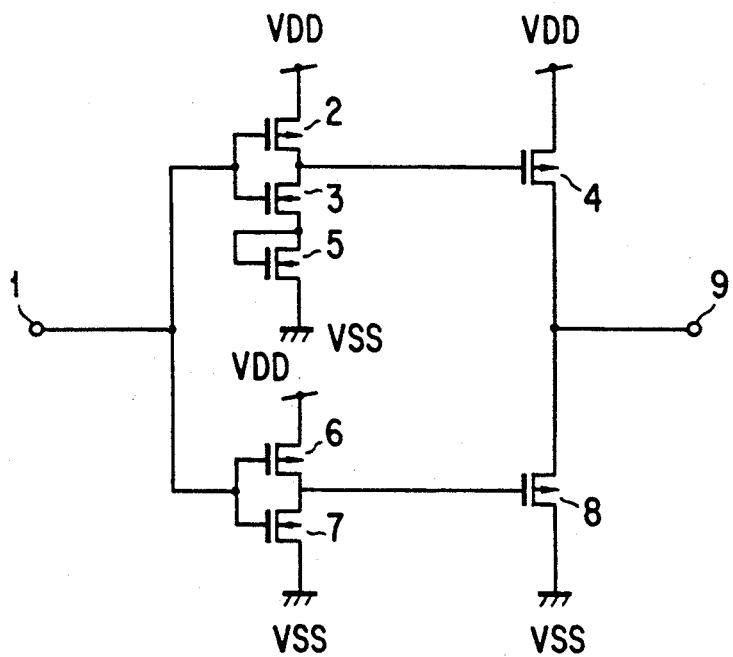
FIG. 4 is a circuit diagram showing an arrangement of an output buffer according to a first embodiment of the present invention.

FIG. 4 is a circuit diagram showing an arrangement of a CMOS output buffer according to the present invention. Both the gates of a P-channel MOS transistor 2 and an N-channel MOS transistor 3 are connected to an input terminal 1. Both the drains of the transistors 2 and 3 are connected to the gate of a P-channel MOS transistor 4 for pulling up an output of the final stage. The sources of the transistors 2 and 4 are connected to power supply voltages VDD. The gate and drain of an N-channel MOS transistor 5 are connected to the source of the transistor 3. The source of the transistor 5 is connected to a ground voltage VSS. The transistor 5 is used for clipping a voltage. In this arrangement, the transistor 2 serves as a pull-up circuit and the transistors 3 and 5 serve as pull-down circuit to control the gate voltage of the P-channel MOS transistor 4, thereby driving the transistor 4.

Both the gates of a P-channel MOS transistor 6 and an N-channel MOS transistor 7 are connected to the input terminal 1. Both the drains of the transistors 6 and 7 are connected to the gate of an N-channel MOS transistor 8 for pulling down an output of the final stage. The sources of the transistors 7 and 8 are connected to ground voltages VSS. The source of the transistor 6 is connected to a power supply voltage VDD. Both the drains of the transistors 4 and 8 are connected to an output terminal 9. In this arrangement, the transistor 6 serves as a pull-up circuit and the transistor 7 serves as a pull-down circuit to control the gate voltage of the N-channel MOS transistor 8, thereby driving the transistor 8.

The transistors 6 and 7 for driving the transistor 8 are so constructed as to meet the following conditions.

The time required for changing a gate-to-source voltage (VGS) of the transistor 8 from "L" to "H" by turning on the transistor 6 is longer than the time required for changing the VGS of the transistor 8 from "H" to "L" by turning on the transistor 7. In other words, the channel length of the transistor 6 is larger than that of each of the other transistors, and the channel width of the transistor 6 is smaller than that of each of the other transistors.

Figure 5:
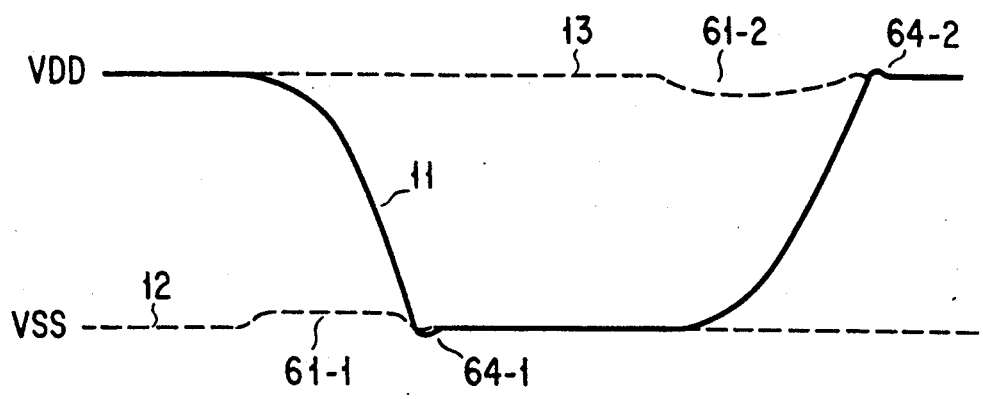
FIG. 5 is a view showing operating waveforms of the output buffer of FIG. 4.

FIG. 5 shows operating waveforms of the output buffer of FIG. 4 which is formed when the level of an input signal is changed. The operating waveforms are an output waveform 11, a VSS waveform 12, and a VDD waveform 13.

When the input signal is changed from "H" to "L," the VGS of the transistor 4 quickly becomes high in level, and the transistor 4 is turned off. It is thus unnecessary to worry about through current even though the transistor 8 is turned on. Since the drive ability of the transistor 6 is small, the VGS of the transistor 8 does not rise suddenly, the variation in the current flowing to the transistor 8, which is proportionate to power supply noise, is small, and the initial noise 61-1 can be reduced. The output voltage of the output buffer is then lowered while discharging a capacitive load. A discharge current decreases after it reaches a peak, and a variation in this current is small since the VGS of the transistor is kept low and the drive ability thereof is small. The ringing noise 64-1 is therefore decreased.

Since the capacity of the capacitive load which parasitizes the output terminal 9 can be somewhat expected, the time necessary for the output voltage to reach an "L" level can be predicted. The size of the transistor 6 is determined so that the VGS of the transistor 8 becomes equal to the power supply voltage VDD after the output voltage reaches the "L" level. Therefore, the drive ability of the transistor 8 is not reduced.

When the input signal is changed from "L" to "H," the VGS of the transistor 8 promptly becomes low in level, and the transistor 8 is turned off. Since the VGS of the transistor 4 gently changes to the "L" level because of the current limiting action and voltage clipping action of the transistor 5. The initial noise 61-2 and ringing noise 64-2 can thus be decreased. Since, however, the VGS of the transistor 4 is clipped by the transistor 5, the drive ability of the transistor 4 is somewhat reduced.

For example, the transistors constituting the output buffer shown in FIG. 4 have the following channel widths W and channel lengths L.

Figure 6:
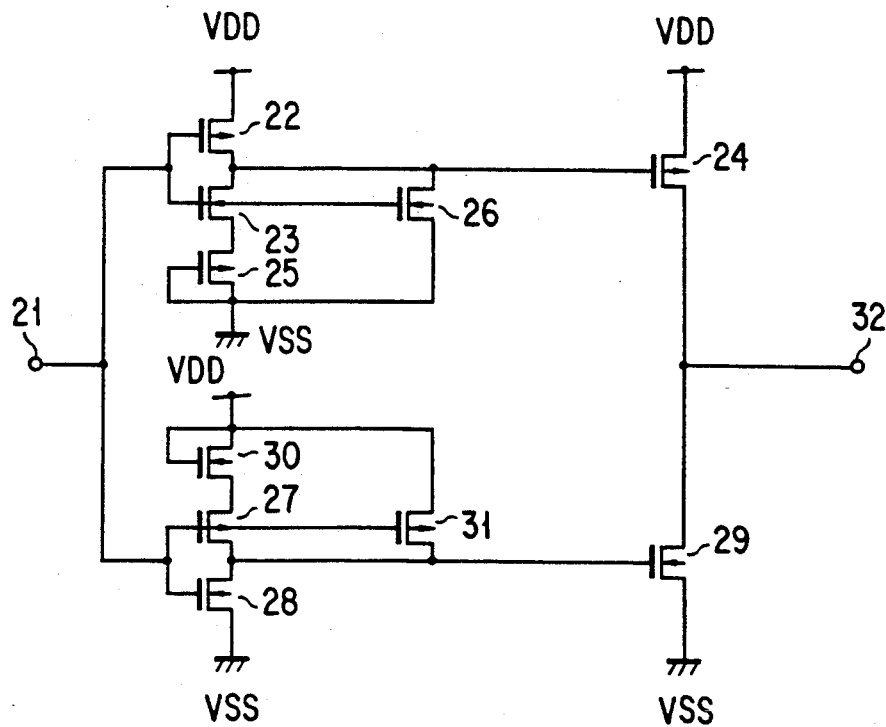
FIG. 6 is a circuit diagram showing an arrangement of an output buffer according to a second embodiment of the present invention.

Transistors 2, 3, 5 and 7 ... W=20 μm, L=1 μm
Transistor 6 ... W=4 μm, L=3.5 μm
Transistor 4 ... W=320 μm, L=1 μm
Transistor 8 ... W=128 μm, L=1 μm FIG. 6 is a circuit diagram showing an arrangement of a CMOS output buffer according to a second embodiment of the present invention. Both the gates of a P-channel MOS transistor 22 and an N-channel MOS transistor 23 are connected to an input terminal 21. Both the drains of the transistors 22 and 23 are connected to the gate of a P-channel MOS transistor 24 for pulling up an output of the final stage. The sources of the transistors 22 and 24 are connected to power supply voltages VDD. The source of a P-channel MOS transistor 25 is connected to the source of the transistor 23. The gate and drain of the transistor 25 are connected to a ground voltage VSS. The transistor 25 is used for limiting a current. The drain of an N-channel MOS transistor 26 is connected to the gate of the transistor 24. The gate of the transistor 26 is connected to the gate of the transistor 23, and the drain of the transistor 26 is connected to the ground voltage VSS. The transistor 26 is used to compensate for a voltage level. In this arrangement, the transistor 22 serves as a pull-up circuit and the transistors 23, 25 and 26 serve as pull-down circuits to control the gate voltage of the P-channel MOS transistor 24, thereby driving the transistor 24.

Both the gates of a P-channel MOS transistor 27 and an N-channel MOS transistor 28 are connected to the input terminal 21. Both the drains of the transistors 27 and 28 are connected to the gate of an N-channel MOS transistor 29 for pulling down an output of the final stage. The sources of the transistors 28 and 29 are connected to ground voltages VSS. The source of an N-channel MOS transistor 30 is connected to the source of the transistor 27. The gate and drain of the transistor 30 are connected to a power supply voltage VDD. The transistor 25 is used for limiting a current. The drain of a P-channel MOS transistor 31 is connected to the gate of the transistor 29. The gate of the transistor 31 is connected to the gate of the transistor 27, and the drain of the transistor 31 is connected to the power supply voltage VDD. The transistor 31 is used to compensate for a voltage level. In this arrangement, the transistors 27, 30 and 31 serve as pull-up circuit and the transistor 28 serves as a pull-down circuit to control the gate voltage of the N-channel MOS transistor 29, thereby driving the transistor 29.

In the above arrangement of the second embodiment, since the transistor 25 (30) limits the operating current of the transistor 23 (27) by a back gate bias effect, the VGS of the transistor 24 (29) does not reach the VSS (VDD). The transistor 26 (31) compensates for the level of the VGS of the transistor 24 (29) to make the VGS reach the VSS (VDD). The channel length and channel width of the transistor 26 (31) are set so that its drive ability is reduced.

An operation of the output buffer shown in FIG. 6 in which an input signal changes from "H" to "L" will be described. The VGS of the transistor 24 promptly becomes high in level, and the transistor 24 is turned off. The VGS of the transistor 29 is increased by the pull-up operation of the transistors 27 and 31. Since, however, the operation of the transistor 27 is limited by the transistor 30, and the driving force of the transistor 31 is reduced from the first, the VGS of the transistor 29 does not increase suddenly. It is thus possible to reduce the initial noise and ringing noise.

Even though the transistor 27 is simply operated, the VGS of the transistor 29 will be clipped by the transistor 30. Therefore, the VGS of the transistor 29 cannot be increased to the VDD. The transistor 31 compensates for the level of the VGS of the transistor 29 so that it reaches the VDD after the output voltage reaches the "L" level. The same is true of an operation of the output buffer shown in FIG. 6 in which the input signal changes from "L" to "H." The noise generated from the output buffer shown in FIG. 6 is reduced as expressed by the waveform shown in FIG. 5.

Figure 7:
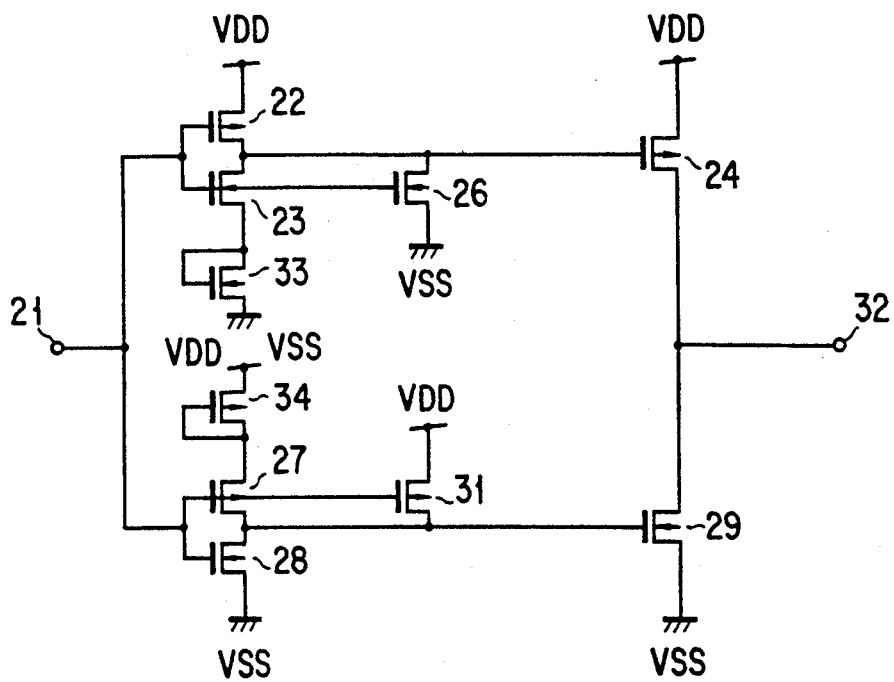
FIG. 7 is a circuit diagram showing an arrangement of an output buffer according to a third embodiment of the present invention.

FIG. 7 is a circuit diagram showing an arrangement of a CMOS output buffer according to a third embodiment of the present invention. In this arrangement, an N-channel MOS transistor 33 is provided in place of the P-channel MOS transistor 25 in FIG. 6, and a P-channel MOS transistor 34 is provided in place of the N-channel MOS transistor 30. The gate and drain of the transistor 33 are connected to each other to form a diode, and the gate and drain of the transistor 34 are also connected to each other to form a diode.

The transistor 33 (34) constitutes a clamp circuit using a threshold voltage. The operation of the transistor 23 (27) is thus clamped at a predetermined voltage to prevent the VGS of the transistor 24 (29) from increasing suddenly. After that, as in the output buffer shown in FIG. 6, the transistor 26 (31) whose drive ability is low compensates for the level of the VGS of the transistor 24 (29) so that the VGS reaches the VSS (VDD). The initial noise and ringing noise can thus be reduced. In this arrangement, the clamp voltage can be adjusted by varying the threshold values of the transistors 33 and 34.

As described above, in the CMOS output buffer according to the present invention, a variation in current can be controlled by directly controlling the waveform of the source-to-drain voltage VGS of the transistor, and noise can reliably be reduced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A CMOS output buffer comprising:
   first P- and N-channel MOS transistors whose drains are connected to an output terminal, constituting a final output stage, a source of said first P-channel MOS transistor being connected to a power supply potential and a source of said first N-channel MOS transistor being connected to a ground potential;
   second P- and N-channel MOS transistors whose gates are connected to each other to receive an input signal and whose drains are connected to a gate of said first P-channel MOS transistor, a source of said second P-channel MOS transistor being connected to a power supply potential;
   a third P-channel MOS transistor whose source and drain are connected between a source of said second N-channel MOS transistor and a ground potential, a gate of said third P-channel MOS transistor being connected to the ground potential;
   a third N-channel MOS transistor whose gate is supplied with the input signal, drain is connected to a gate of said first P-channel MOS transistor, and source is connected to the ground potential;
   fourth N- and P-channel MOS transistors whose gates are connected to each other to receive the input signal and drains are connected to a gate of said first N-channel MOS transistor, a source of said fourth N-channel MOS transistor being connected to a ground potential;
   a fifth N-channel MOS transistor whose source and drain are connected between a source of said fourth P-channel MOS transistor and a power supply potential, a gate of said fifth N-channel MOS transistor being connected to the power supply potential; and
   a fifth P-channel MOS transistor whose gate is supplied with the input signal, drain is connected to the gate of said first N-channel MOS transistor, and source is connected to the power supply potential.

2. The CMOS output buffer according to claim 1, wherein said third P-channel MOS transistor clamps a potential at the source of said second N-channel MOS transistor by a back gate bias effect, and said fifth N-channel MOS transistor clamps a potential at the source of said fourth P-channel MOS transistor by the back gate bias effect.

3. The CMOS output buffer according to claim 2, wherein said third N-channel MOS transistor and said fifth P-channel MOS transistor each have a driving force which is smaller than that of each of the other MOS transistors.

4. The CMOS output buffer according to claim 3, wherein said third N-channel MOS transistor continues to turn on after an on-state of said second N-channel MOS transistor is saturated, thereby maximizing a difference in potential between the gate and the source of said first P-channel MOS transistor.

5. The CMOS output buffer according to claim 3, wherein said fifth P-channel MOS transistor continues to turn on after an on-state of said fifth P-channel MOS transistor is saturated, thereby maximizing a difference in potential between the gate and the source of said first N-channel MOS transistor.

6. A CMOS output buffer comprising:
   main drive P- and N-channel MOS transistors whose drains are connected to an output terminal, constituting a final output stage, a source of said main drive P-channel MOS transistor being connected to a power supply potential and a source of said main drive N-channel MOS transistor being connected to a ground potential; and
   a CMOS inverter circuit whose input node is supplied with an input signal and an output node is connected to a gate of said main drive P-channel MOS transistor, said CMOS inverter circuit being arranged between said power supply potential and said ground potential, and comprising a current path for pulling down the output node of said CMOS inverter circuit, and a P-channel MOS transistor, a source and a drain of which are connected between said current path and said ground potential, for clamping a pull-down potential of the output node of said CMOS inverter circuit, a gate of said P-channel MOS transistor being connected to the ground potential.

7. The CMOS output buffer according to claim 6, wherein said CMOS inverter circuit further comprises an auxiliary N-channel MOS transistor having a driving force which is smaller than that of each of other transistors, for changing the pull-down potential of the output node of said CMOS inverter to a ground potential, a gate of said auxiliary N-channel MOS transistor being supplied with the input signal, a drain thereof being connected to the gate of said main drive P-channel MOS transistor, and a source thereof being connected to the ground potential.

8. A CMOS output buffer comprising:
main drive P- and N-channel MOS transistors whose drains are connected to an output terminal, constituting a final output stage, a source of said main drive P-channel MOS transistor being connected to a power supply potential and a source of said main drive N-channel MOS transistor being connected to a ground potential; and a CMOS inverter circuit whose input node is supplied with an input signal and output node is connected to a gate of said main drive N-channel MOS transistor, said CMOS inverter circuit being arranged between said power supply potential and said ground potential, and comprising a current path for pulling up the output node of said CMOS inverter circuit, and an N-channel MOS transistor, a source and a drain of which are connected between said current path and said power supply potential, for clamping a pull-up potential of the output node of said CMOS inverter circuit, a gate of said N-channel MOS transistor being connected to the power supply potential.

9. The CMOS output buffer according to claim 8, wherein said CMOS inverter circuit further comprises an auxiliary P-channel MOS transistor having a driving force which is smaller than that of each of the other transistors, for changing the pull-up potential of the output node of said CMOS inverter to a power supply potential, a gate of said auxiliary P-channel MOS transistor being supplied with the input signal, a drain thereof being connected to the gate of said main drive N-channel MOS transistor, and a source thereof being connected to the power supply potential.

* * * * *